US009691929B2

(12) United States Patent
Cornfeld et al.

(10) Patent No.: US 9,691,929 B2
(45) Date of Patent: Jun. 27, 2017

(54) FOUR JUNCTION INVERTED METAMORPHIC MULTIJUNCTION SOLAR CELL WITH TWO METAMORPHIC LAYERS

(71) Applicant: SolAero Technologies Corp., Albuquerque, NM (US)

(72) Inventors: Arthur Cornfeld, Sandia Park, NM (US); Benjamin Cho, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 145 days.

(21) Appl. No.: 14/243,732

(22) Filed: Apr. 2, 2014

(65) Prior Publication Data

US 2015/0107658 A1 Apr. 23, 2015

Related U.S. Application Data

(63) Continuation of application No. 12/271,192, filed on Nov. 14, 2008, now abandoned.

(51) Int. Cl.
*H01L 31/0687* (2012.01)
*H01L 31/18* (2006.01)
*H01L 31/078* (2012.01)

(52) U.S. Cl.
CPC ...... *H01L 31/06875* (2013.01); *H01L 31/078* (2013.01); *H01L 31/1844* (2013.01);
(Continued)

(58) Field of Classification Search
CPC ....... H01L 31/00; H01L 31/02; H01L 31/047; H01L 31/06; H01L 31/0725;
(Continued)

(56) References Cited

U.S. PATENT DOCUMENTS 3,488,834 A 1/1970 Baird
3,964,155 A 6/1976 Leinkram et al.
(Continued)

FOREIGN PATENT DOCUMENTS

EP 1109230 A2 6/2001
EP 1 863 099 A2 12/2007
(Continued)

OTHER PUBLICATIONS

Griggs et al., "Design Approaches and Materials Processes for Ultrahigh Efficiency Lattice Mismatched Multi-Junction Solar Cells", Conference Record 2006 IEEE 4$^{th}$ World Conference on Photovoltaic Energy Conversion (IEEE Cat. No. 06CH37747), pp. 857-860 (May 2006).
(Continued)

*Primary Examiner* — Christina Chern

(57) ABSTRACT

A multijunction solar cell including an upper first solar subcell having a first band gap; a second solar subcell adjacent to the first solar subcell and having a second band gap smaller than the first band gap; a first graded interlayer adjacent to the second solar subcell; the first graded interlayer having a third band gap greater than the second band gap; and a third solar subcell adjacent to the first graded interlayer, the third subcell having a fourth band gap smaller than the second band gap such that the third subcell is lattice mismatched with respect to the second subcell. A second graded interlayer is provided adjacent to the third solar subcell; the second graded interlayer having a fifth band gap greater than the fourth band gap; and a lower fourth solar subcell is provided adjacent to the second graded interlayer, the lower fourth subcell having a sixth band gap smaller than the fourth band gap such that the fourth subcell is lattice mismatched with respect to the third subcell.

13 Claims, 27 Drawing Sheets

(52) U.S. Cl.
CPC ........ *H01L 31/1892* (2013.01); *Y02E 10/544* (2013.01); *Y02P 70/521* (2015.11)

(58) Field of Classification Search
CPC ..... H01L 31/074; H01L 31/18; H01L 31/184; H01L 31/1844
See application file for complete search history.

(56) References Cited

U.S. PATENT DOCUMENTS

| | | | |
|---|---|---|---|
| 4,001,864 A | 1/1977 | Gibbons et al. | |
| 4,255,211 A | 3/1981 | Fraas | |
| 4,338,480 A | 7/1982 | Antypas et al. | |
| 4,393,576 A | 7/1983 | Dahlberg | |
| 4,612,408 A | 9/1986 | Moddel et al. | |
| 4,881,979 A | 11/1989 | Lewis | |
| 4,963,949 A * | 10/1990 | Wanlass ............ | H01L 21/02381 |
| | | | 136/252 |
| 5,019,177 A | 5/1991 | Wanlass | |
| 5,021,360 A | 6/1991 | Melman et al. | |
| 5,053,083 A | 10/1991 | Sinton et al. | |
| 5,217,539 A | 6/1993 | Fraas et al. | |
| 5,322,572 A | 6/1994 | Wanlass et al. | |
| 5,342,451 A | 8/1994 | Virshup | |
| 5,342,453 A | 8/1994 | Olson | |
| 5,376,185 A | 12/1994 | Wanlass | |
| 5,479,032 A | 12/1995 | Forrest et al. | |
| 5,510,272 A | 4/1996 | Morikawa et al. | |
| 5,944,913 A | 8/1999 | Hou et al. | |
| 6,165,873 A | 12/2000 | Hamada | |
| 6,180,432 B1 | 1/2001 | Freeouf | |
| 6,239,354 B1 | 5/2001 | Wanlass et al. | |
| 6,252,287 B1 | 6/2001 | Kurtz et al. | |
| 6,281,426 B1 | 8/2001 | Olson et al. | |
| 6,300,557 B1 | 10/2001 | Wanlass et al. | |
| 6,300,558 B1 | 10/2001 | Takamoto et al. | |
| 6,340,788 B1 | 1/2002 | King et al. | |
| 6,482,672 B1 | 11/2002 | Hoffman et al. | |
| 6,660,928 B1 | 12/2003 | Patton et al. | |
| 6,690,041 B2 | 2/2004 | Armstrong et al. | |
| 6,951,819 B2 | 10/2005 | Iles et al. | |
| 7,071,407 B2 | 7/2006 | Fatemi et al. | |
| 7,166,520 B1 | 1/2007 | Henley | |
| 7,727,795 B2 | 6/2010 | Stan | |
| 7,741,146 B2 | 6/2010 | Cornfeld | |
| 7,785,989 B2 | 8/2010 | Sharps | |
| 7,842,881 B2 | 11/2010 | Cornfeld | |
| 7,863,516 B2 | 1/2011 | Fafard | |
| 8,507,787 B2 | 8/2013 | Suh | |
| 2002/0117675 A1 | 8/2002 | Mascarenhas | |
| 2003/0226952 A1 | 12/2003 | Clark | |
| 2004/0045598 A1 | 3/2004 | Narayanan | |
| 2004/0065363 A1 | 4/2004 | Fetzer et al. | |
| 2004/0079408 A1 | 4/2004 | Fetzer et al. | |
| 2004/0166681 A1 | 8/2004 | Iles et al. | |
| 2004/0200523 A1 | 10/2004 | King et al. | |
| 2004/0261837 A1 | 12/2004 | Friedman et al. | |
| 2005/0211291 A1 | 9/2005 | Bianchi | |
| 2005/0274411 A1 | 12/2005 | King et al. | |
| 2006/0021565 A1 | 2/2006 | Zahler et al. | |
| 2006/0112986 A1 | 6/2006 | Atwater, Jr. et al. | |
| 2006/0144435 A1 | 7/2006 | Wanlass et al. | |
| 2006/0162768 A1 | 7/2006 | Wanlass et al. | |
| 2006/0185582 A1 | 8/2006 | Atwater, Jr. et al. | |
| 2007/0137694 A1 | 6/2007 | Foster et al. | |
| 2007/0218649 A1 | 9/2007 | Hernandez | |
| 2007/0277873 A1 | 12/2007 | Cornfeld et al. | |
| 2008/0029151 A1 | 2/2008 | McGlynn | |
| 2008/0149173 A1 | 6/2008 | Sharps | |
| 2008/0185038 A1 | 8/2008 | Sharps | |
| 2008/0245409 A1 | 10/2008 | Varghese et al. | |
| 2009/0038679 A1 | 2/2009 | Varghese | |
| 2009/0078308 A1 | 3/2009 | Varghese | |
| 2009/0078309 A1 | 3/2009 | Stan | |
| 2009/0078310 A1 | 3/2009 | Stan | |
| 2009/0078311 A1 | 3/2009 | Stan | |
| 2009/0155952 A1 | 6/2009 | Stan | |
| 2009/0188546 A1 | 7/2009 | McGlynn | |
| 2009/0223554 A1 | 9/2009 | Sharps | |
| 2009/0229658 A1 | 9/2009 | Stan | |
| 2009/0229662 A1 | 9/2009 | Stan | |
| 2009/0272430 A1 | 11/2009 | Cornfeld | |
| 2009/0272438 A1 | 11/2009 | Cornfeld | |
| 2009/0288703 A1 | 11/2009 | Stan | |
| 2009/0314348 A1 | 12/2009 | McGlynn | |
| 2010/0012174 A1 | 1/2010 | Varghese | |
| 2010/0012175 A1 | 1/2010 | Varghese | |
| 2010/0031994 A1 | 2/2010 | Varghese | |
| 2010/0047959 A1 | 2/2010 | Cornfeld | |
| 2010/0093127 A1 | 4/2010 | Sharps | |
| 2010/0116327 A1 | 5/2010 | Cornfeld | |
| 2010/0122764 A1 | 5/2010 | Newman | |
| 2010/0147366 A1 | 6/2010 | Stan | |
| 2010/0186804 A1 | 7/2010 | Cornfeld | |
| 2010/0203730 A1 | 8/2010 | Cornfeld | |
| 2010/0206365 A1 | 8/2010 | Chumney | |
| 2010/0229913 A1 | 9/2010 | Cornfeld | |
| 2010/0229926 A1 | 9/2010 | Newman | |
| 2010/0229932 A1 | 9/2010 | Cornfeld | |
| 2010/0229933 A1 | 9/2010 | Cornfeld | |
| 2010/0233838 A1 | 9/2010 | Varghese | |
| 2010/0233839 A1 | 9/2010 | Cornfeld | |
| 2010/0236615 A1 | 9/2010 | Sharps | |
| 2010/0248411 A1 | 9/2010 | Cornfeld | |
| 2010/0282288 A1 | 11/2010 | Cornfeld | |
| 2011/0030774 A1 | 2/2011 | Cornfeld | |
| 2011/0041898 A1 | 2/2011 | Cornfeld | |
| 2012/0103403 A1 | 5/2012 | Misra et al. | |

FOREIGN PATENT DOCUMENTS

| | | |
|---|---|---|
| EP | 0 658 944 B1 | 4/2009 |
| FR | 2 878 076 A1 | 5/2006 |
| WO | 2005/015638 A1 | 2/2005 |

OTHER PUBLICATIONS

Law et al., "Future technology pathways of terrestrial III-V multijunction solar cells for concentrator photovoltaic systems," Solar Energy Materials and Solar Cells, Elsevier Science Publishers, vol. 14.94, No. 8 pp. 1314-1318 (Oct. 2008).

Lewis et al., "The crystallographic connection of MOCVD-grown monolithic cascade subcells via transparent graded layers," J. of Crystal Growth, vol. 69, pp. 515-526 (1984).

Lewis et al., "Recent developments in multijunction solar cell research," J. Solar Cells, vol. 24, pp. 171-183 (1988).

Li, et al., "Unintentional doping and compensation effects of carbon in metal-organic chemical vapor deposition fabricated ZnO thin films," Vacuum Science & Technology, vol. A 24, pp. 1213-1217 (2006).

U.S. Appl. No. 12/265,113, filed Nov. 5, 2008, Varghese.
U.S. Appl. No. 12/708,361, filed Feb. 18, 2010, Cornfeld.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/775,946, filed May 7, 2010, Newman.
U.S. Appl. No. 12/813,408, filed Jun. 10, 2010, Patel.
U.S. Appl. No. 12/844,673, filed Jul. 27, 2010, Stan.

R. Venkatasubramanian, et al., "An Inverted-Growth Approach to Development of an IR-Transparent, High-Efficiency AlGaAs/GaAs Cascade Solar Cell." 22nd IEEE Photovoltaic Specialists Conference, Oct. 7-11, 1991, Las Vegas, NV, US.

R. Venkatasubramanian, et al., "High-quality eutectic-metal-bonded AlGaAs—GaAs thin films on Si substrates." Applied Physics Letters, vol. 60, No. 7, pp. 886-888. Feb. 17, 1992. American Institute of Physics, Melville, NY, US.

M. Yamaguchi, "Physics and Technologies of Superhigh-Efficiency Tandem Solar Cells." Semiconductors, vol. 33, No. 9, Sep. 1999, pp. 961-964. Toyota Technological Institute, Nagoya, Japan. © 1999, American Institute of Physics.

(56) References Cited

OTHER PUBLICATIONS

R.R. King, et al., "Next-Generation, High-Efficiency III-V Multijunction Solar Cells." Conference, Sep. 15-22, 2000, Anchorage, AK, US.

S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ, US.

R.R. King, et al., "High-Efficiency Space and Terrestrial Multijunction Solar Cells Through Bandgap Control in Cell Structures." 2002 Photovoltaic Specialists Conference, Conference Record of the 29th IEEE, May 19-24, 2002, pp. 776-781. New Orleans, LA, US.

M.W. Wanlass et al., "Lattice-Mismatched Approaches for High-Performance, III-V Photovoltaic Energy Converters." Proceedings of the 31st IEEE PVSC, Jan. 3-7, 2005, Lake Buena Vista, FL, US.

Takamoto, T., et al., "InGaP/GaAs-based Multijunction Solar Cells." Progress in Photovoltaics: Research and Applications, 2005; vol. 13, pp. 495-511. Wiley InterScience, John Wiley & Sons, Ltd., Hoboken, NJ, US.

M.W Wanlass et al., "Monolithic, Ultra-Thin GaInP/GaAs/GaInAs Tandem Solar Cells." 2006 IEEE $4^{th}$ World Conference on Photovoltaic Energy Conversion, May 7-12, 2006, Waikoloa, Hawaii, US.

D.J. Friedman, et al., "0.7-eV GaInAs Junction for a GaInP/GaAs/ GaInAs (1 eV)/GaInAs (0.7eV) Four-Junction Solar Cell." 2006 IEEE 4th World Conference on Photovoltaic Energy Conversion, May 7-12, 2006, Waikoloa, Hawaii, US.

J.F. Geisz, et al., "High-efficiency GaInP/GaAs/InGaAs triple-junction solar cells grown inverted with a metamorphic bottom junction." Applied Physics Letters 91, 023502 (2007), pp. 023502-1-023502-3 Online publication Jul. 10, 2007, American Institute of Physics, Melville, NY, US.

P. Sharps, et al., "Inverting the triple junction improves efficiency and flexibility." Compound Semiconductor. Oct. 2007, pp. 25-28. OP Publishing, Ltd., Bristol, England.

H. Yoon, et al., "Progress of Inverted Metamorphic III-V Solar Cell Development at Spectrolab.", $33^{rd}$ IEEE Photovoltaic Specialists Conference, May 11-16, 2008, San Diego, CA, US.

J.F. Geisz, et al., "Inverted GaInP / (In)GaAs / InGaAs Triple-Junction Solar Cells with Low-Stress Metamorphic Bottom Junctions." 33rd IEEE Photovoltaic Specialists Conference, May 11-16, 2008, San Diego, CA, US.

A. Cornfeld, et al., "Development of a Large Area Inverted Metamorphic Multi-junction (IMM) Highly Efficient AM0 Solar Cell." 33rd IEEE Photovoltaic Specialists Conference, May 11-16, 2008, San Diego, CA, US.

A. Cornfeld, et al., "Development of a Large Area Inverted Metamorphic Multi-junction Highly Efficient AM0 Solar Cell." Conference paper presented at the 33rd IEEE Photovoltaic Specialists Conference (May 11-16, 2008) on May 12, 2008. San Diego, CA, US.

M. Stan, et al., "Very High Efficiency Triple Junction Solar Cells by MOVPE." $14^{th}$ International Conference of Metalorganic Vapor Phase Epitaxy. Jun. 1-6, 2008, Metz, France.

A. Cornfeld, et al., "Advances in the Performance of Inverted Metamorphic Multi junction Solar Cells." Photovoltaic Energy Conference, Sep. 1-5, 2008, Valencia, Spain.

P. Wurfel. Physics of Solar Cells: from Basic Principles to Advanced Concepts $2^{nd}$, Updated and Expanded Edition. 2009. Sections 6.4,6.5 and 6.8. 20 pages. Wiley-VCH, Weinheim, Germany.

Sexl, M., et al., "MBE Growth of Metamorphic In(Ga)AIAs Buffers." 1997 IEEE International Symposium on Compound Semiconductors. Sep. 1997, pp. 49-52. IEEE, Piscataway, NJ.

Stan, M., et al., "High-efficiency quadruple junction solar cells using OMVPE with inverted metamorphic device structures." Journal of Crystal Growth 312 (2010), pp. 1370-1374. Elsevier, Amsterdam, Netherlands.

Takamoto, T., et al., "Future Development of InGaP/(ln)GaAs Based Multijunction Solar Cells." Proceedings of the 31 st IEEE PVSC, Jan. 3-7, 2005, pp. 519-524. Lake Buena Vista, FL, US.

Aiken et al., "Consideration of High Bandgap Subcells for Advanced Multijunction Solar Cells," Conference Record o/the 2006 IEEE 4th World Conference on Photovoltaic Energy Conversion, 2006:838-841.

Schultz et al., "High Efficiency 1.0-eV GaInAs Bottom Solar Cell for 3-Junction Monolithic Stack," IEEE, 1990:148-152.

Partial European Search Report, Application No. EP 08 01 3466. Feb. 12, 2009. European Patent Office, Berlin, Germany.

European Search Report, Application No. EP 08 01 3466. Dec. 18, 2009. European Patent Office, Berlin, Germany.

Office Action mailed Jan. 4, 2011. U.S. Appl. No. 11/445,793. (Sexl reference, double patenting rejection).

Advisory Action mailed Mar. 15, 2011. U.S. Appl. No. 11/445,793.

Office Action mailed Nov. 8, 2010 (double patenting rejection). U.S. Appl. No. 12/047,842.

Office Action mailed Aug. 22, 2011, U.S. Appl. No. 12/271,192.

Office Action (Final Rejection) mailed Feb. 14, 2012, U.S. Appl. No. 12/271,192.

Office Action (Non-Final Rejection After RCE) mailed Oct. 8, 2013, U.S. Appl. No. 12/271,192.

\* cited by examiner

FOUR JUNCTION INVERTED METAMORPHIC MULTIJUNCTION SOLAR CELL WITH TWO METAMORPHIC LAYERS

REFERENCE TO RELATED APPLICATIONS

This application is a continuation, and claims priority, of co-pending U.S. application Ser. No. 12/271,192, filed Nov. 14, 2008. The contents of the prior application are incorporated herein by reference in their entirety.

This application is related to co-pending U.S. patent application Ser. No. 12/267,812 filed Nov. 10, 2008.

This application is related to co-pending U.S. patent application Ser. No. 12/258,190 filed Oct. 24, 2008.

This application is related to co-pending U.S. patent application Ser. No. 12/253,051 filed Oct. 16, 2008.

This application is related to co-pending U.S. patent application Ser. No. 12/190,449, filed Aug. 12, 2008.

This application is related to co-pending U.S. patent application Ser. No. 12/187,477, filed Aug. 7, 2008.

This application is related to co-pending U.S. patent application Ser. No. 12/218,582 filed Jul. 18, 2008.

This application is related to co-pending U.S. patent application Ser. No. 12/218,558 filed Jul. 17, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. patent application Ser. No. 12/047,842, and U.S. Ser. No. 12/047,944, filed Mar. 13, 2008.

This application is related to co-pending U.S. patent application Ser. No. 12/023,772, filed Jan. 31, 2008.

This application is related to co-pending U.S. patent application Ser. No. 11/956,069, filed Dec. 13, 2007.

This application is also related to co-pending U.S. patent application Ser. Nos. 11/860,142 and 11/860,183 filed Sep. 24, 2007.

This application is also related to co-pending U.S. patent application Ser. No. 11/836,402 filed Aug. 8, 2007.

This application is also related to co-pending U.S. patent application Ser. No. 11/616,596 filed Dec. 27, 2006.

This application is also related to co-pending U.S. patent application Ser. No. 11/614,332 filed Dec. 21, 2006.

This application is also related to co-pending U.S. patent application Ser. No. 11/445,793 filed Jun. 2, 2006.

This application is also related to co-pending U.S. patent application Ser. No. 11/500,053 filed Aug. 7, 2006.

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties relating to the appropriate choice of materials and fabrication steps.

Prior to the present invention, the materials and fabrication steps disclosed in the prior art have not been adequate to produce a commercially viable and energy efficient solar cell using commercially established fabrication processes for producing an inverted metamorphic multijunction cell structure.

SUMMARY OF THE INVENTION

Briefly, and in general terms, the present invention provides a multijunction solar cell including an upper first solar subcell having a first band gap; a second solar subcell adjacent to said first solar subcell and having a second band gap smaller than said first band gap; a first graded interlayer adjacent to said second solar subcell; said first graded interlayer having a third band gap greater than said second band gap; and a third solar subcell adjacent to said first graded interlayer, said third subcell having a fourth band gap smaller than said second band gap such that said third subcell is lattice mismatched with respect to said second subcell; a second graded interlayer adjacent to said third solar subcell; said second graded interlayer having a fifth band gap greater than said fourth band gap; and a lower fourth solar subcell adjacent to said second graded interlayer, said lower subcell having a sixth band gap smaller than said fourth band gap such that said fourth subcell is lattice mismatched with respect to said third subcell.

In another aspect the present invention provides a method of manufacturing a solar cell by providing a first substrate; forming an upper first solar subcell having a first band gap on said first substrate; forming a second solar subcell adjacent to said first solar subcell and having a second band gap smaller than said first band gap; forming a first graded interlayer adjacent to said second solar subcell; said first graded interlayer having a third band gap greater than said second band gap; forming a third solar subcell adjacent to said first graded interlayer, said third subcell having a fourth band gap smaller than said second band gap such that said third subcell is lattice mismatched with respect to said second subcell; forming a second graded interlayer adjacent to said third solar subcell; said second graded interlayer having a fifth band gap greater than said fourth band gap; forming a lower fourth solar subcell adjacent to said second graded interlayer, said lower subcell having a sixth band gap smaller than said fourth band gap such that said fourth subcell is lattice mismatched with respect to said third subcell; mounting a surrogate substrate on top of fourth solar subcell; and removing the first substrate.

BRIEF DESCRIPTION OF THE DRAWINGS

The invention will be better and more fully appreciated by reference to the following detailed description when considered in conjunction with the accompanying drawings, wherein.

DESCRIPTION OF THE PREFERRED EMBODIMENT

Figure 1:
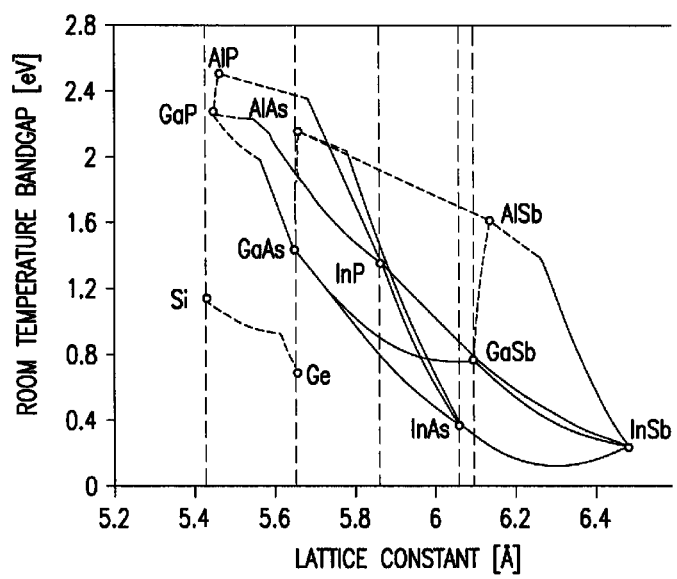
FIG. 1 is a graph representing the bandgap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e. a band gap in the range of 0.7 to 1.2 eV). A surrogate substrate or support structure is then attached or provided over the "bottom" or substantially lattice-mismatched lower subcell, and the growth semiconductor substrate is subsequently removed. (The growth substrate may then subsequently be re-used for the growth of a second and subsequent solar cells).

A variety of different features of inverted metamorphic multijunction solar cells are disclosed in the related applications noted above. Some or all of such features may be included in the structures and processes associated with the solar cells of the present invention. However, more particularly, the present invention is directed to the fabrication of a four junction inverted metamorphic solar cell using two different metamorphic layers, all grown on a single growth substrate. In the present invention, the resulting construction includes four subcells, with band gaps in the range of 1.8 to 2.1 eV, 1.3 to 1.5 eV, 0.9 to 1.1 eV, and 0.6 to 0.8 eV respectively.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
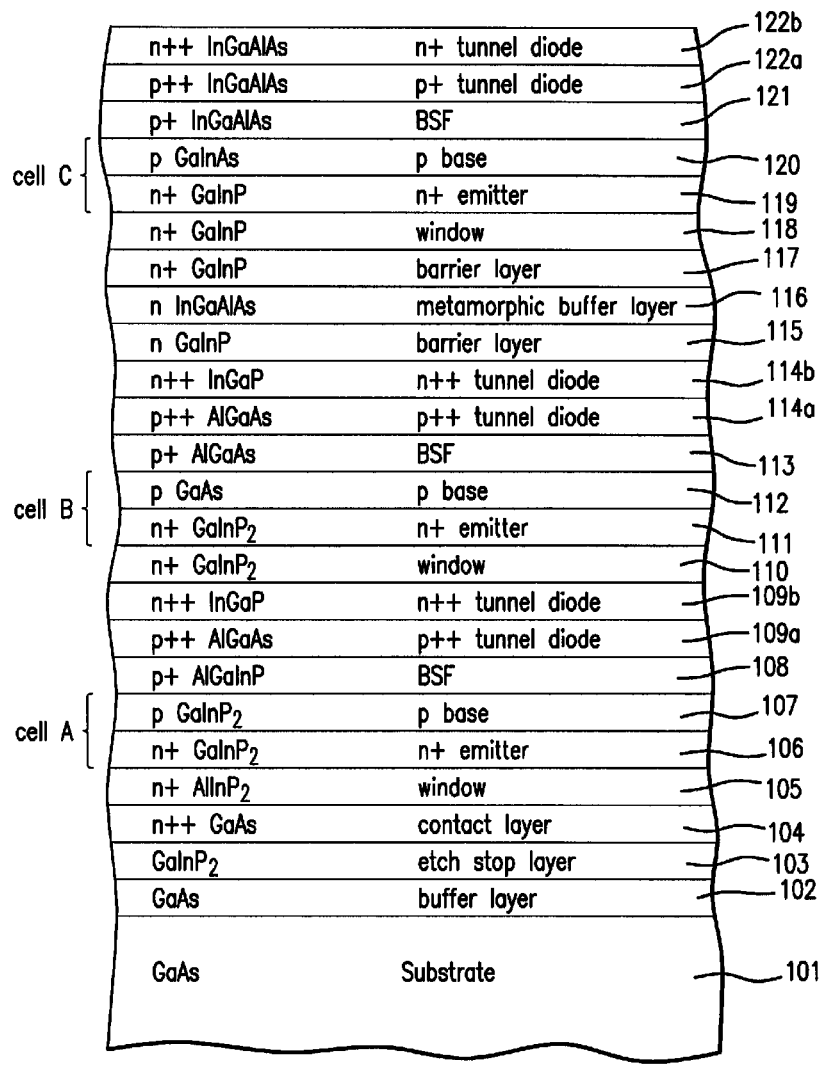
FIG. 2 is a cross-sectional view of the solar cell of the present invention after an initial stage of fabrication including the deposition of certain semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111) A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In the preferred embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 20.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. patent application Ser. No. 12/258,190, filed Oct. 24, 2008. The window layer 110 used in the subcell B also operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 20.

In previously disclosed implementations of an inverted metamorphic solar cell, the middle cell was a homostructure. In the present invention, similarly to the structure disclosed in U.S. patent application Ser. No. 12/023,772, the middle subcell becomes a heterostructure with an InGaP emitter and its window is converted from InAlP to InGaP. This modification eliminated the refractive index discontinuity at the window/emitter interface of the middle subcell, as more fully described in U.S. patent application Ser. No. 12/258, 190, filed Oct. 24, 2008. Moreover, the window layer 110 is preferably is doped three times that of the emitter 111 to move the Fermi level up closer to the conduction band and therefore create band bending at the window/emitter interface which results in constraining the minority carriers to the emitter layer.

In the preferred embodiment of the present invention, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps then the emitters. Therefore, the advantages of using heterojunction subcells are: (i) the short wavelength response for both subcells will improve, and (ii) the bulk of the radiation is more effectively absorbed and collected in the narrower band gap base. The effect will be to increase $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

A barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness, preferably approximately equal to 1.5 eV, or otherwise consistent with a value slightly greater than the bandgap of the middle subcell B. The preferred embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap.

In the surfactant assisted growth of the metamorphic layer 116, a suitable chemical element is introduced into the reactor during the growth of layer 116 to improve the surface characteristics of the layer. In the preferred embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In the preferred embodiment of the present invention, the layer 116 is composed of a plurality of layers of InGaAlAs, with monotonically changing lattice constant, each layer having the same band gap, approximately 1.5 eV.

The advantage of utilizing a constant bandgap material such as InGaAlAs is that arsenide-based semiconductor material is much easier to process in standard commercial MOCVD reactors, while the small amount of aluminum assures radiation transparency of the metamorphic layers.

Although the preferred embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In the preferred embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and n+ type InGaAs respectively, or n+ type InGaP and p type InGaAs for a heterojunction subcell, although another suitable materials consistent with lattice constant and bandgap requirements may be used as well. The doping profile of layers 119 and 120 will be discussed in connection with FIG. 20.

A BSF layer 121, preferably composed of InGaAlAs, is then deposited on top of the cell C, the BSF layer performing the same function as the BSF layers 108 and 113.

The p++/n++ tunnel diode layers 122a and 122b respectively are deposited over the BSF layer 121, similar to the layers 114a and 114b, forming an ohmic circuit element to connect subcell C to subcell D. The layer 122a is preferably composed of p++ InGaAlAs, and layer 122b is preferably composed of n++ InGaAlAs.

Figure 3:
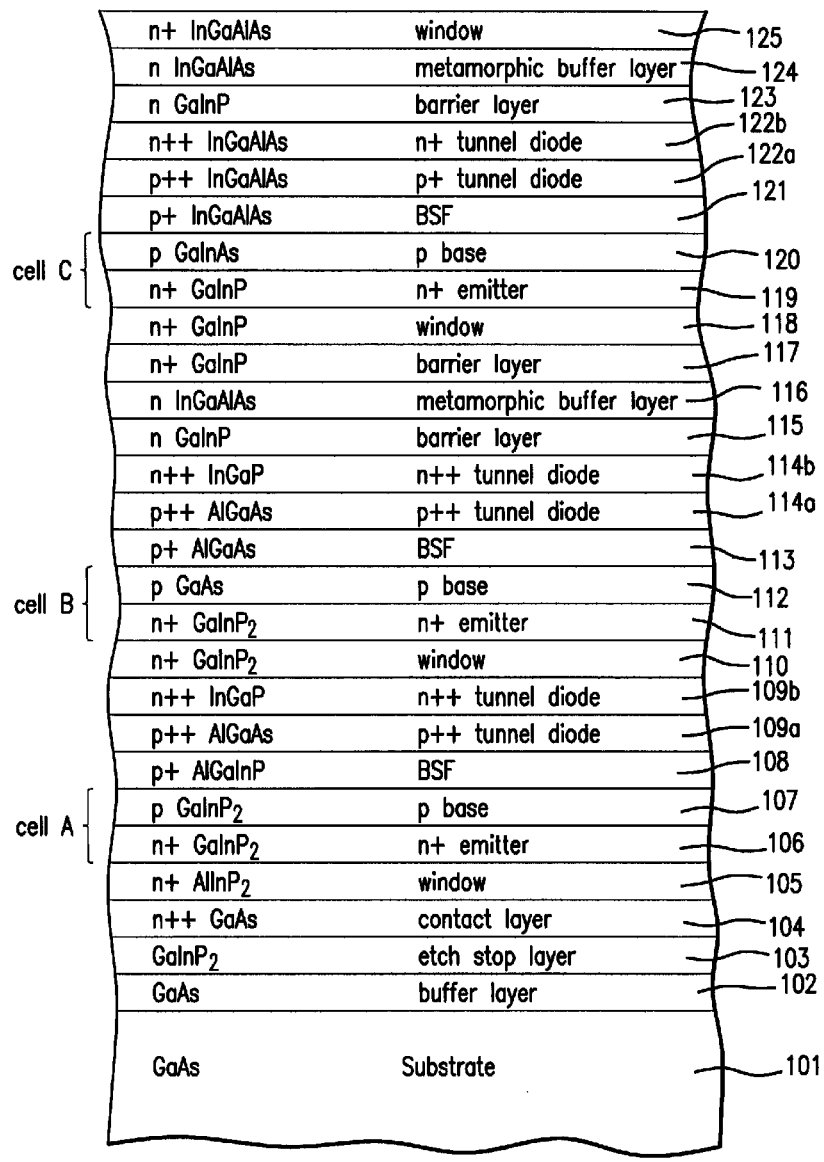
FIG. 3 is a cross-sectional view of the solar cell of FIG. 2 after the next sequence of process steps.

FIG. 3 depicts a cross-sectional view of the solar cell of FIG. 2 after the next sequence of process steps. A barrier layer 123, preferably composed of n-type GaInP, is deposited over the tunnel diode 122a/122b, to a thickness of about 1.0 micron. Such barrier layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A metamorphic layer (or graded interlayer) 124 is deposited over the barrier layer 123 using a surfactant. Layer 124 is preferably a compositionally step-graded series of InGaAlAs layers, preferably with monotonically changing lattice constant, so as to achieve a gradual transition in lattice constant in the semiconductor structure from subcell C to subcell D while minimizing threading dislocations from occurring. The band gap of layer 124 is constant throughout its thickness, preferably approximately equal to 1.1 eV, or otherwise consistent with a value slightly greater than the band gap of the middle subcell C. The preferred embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap.

In the surfactant assisted growth of the metamorphic layer 124, a suitable chemical element is introduced into the reactor during the growth of layer 124 to improve the surface characteristics of the layer. In the preferred embodiment, such element may be a dopant or donor atom such as selenium (Se) or tellurium (Te). Small amounts of Se or Te are therefore incorporated in the metamorphic layer 124, and remain in the finished solar cell. Although Se or Te are the preferred n-type dopant atoms, other non-isoelectronic surfactants may be used as A window layer 125 preferably composed of n+ type InGaAlAs is then deposited over layer 124 (or over a second barrier layer, if there is one, disposed over layer 124,). This window layer operates to reduce the recombination loss in the fourth subcell "D". It should be apparent to one skilled in the art that additional layers may be added or deleted in the cell structure without departing from the scope of the present invention.

Figure 4:
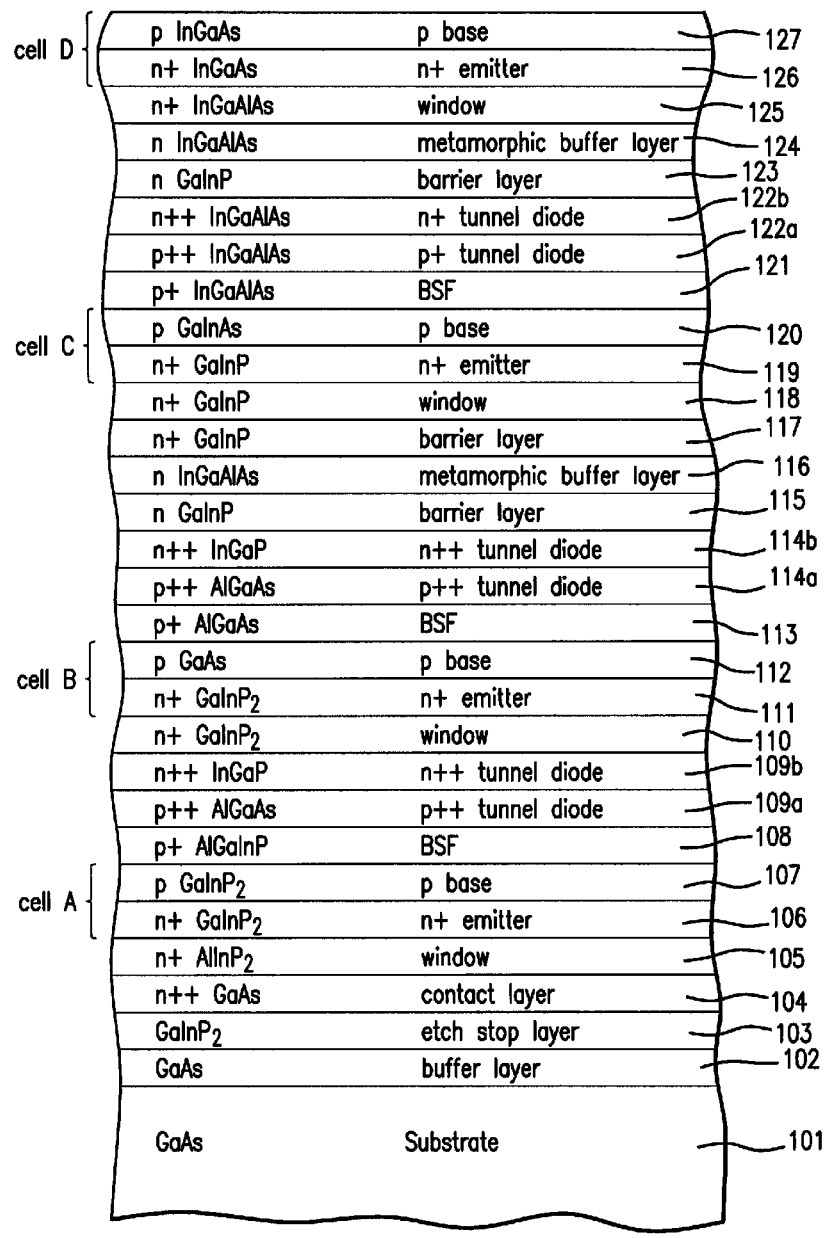
FIG. 4 is a cross-sectional view of the solar cell of FIG. 3 after the next sequence of process steps.

FIG. 4 depicts a cross-sectional view of the solar cell of FIG. 3 after the next sequence of process steps. On top of the window layer 125, the layers of cell D are deposited: the n+ emitter layer 126, and the p-type base layer 127. These layers are preferably composed of n+ type InGaAs and p type InGaAs respectively, or n+ type InGaP and p type InGaAs for a heterojunction subcell, although another suitable materials consistent with lattice constant and bandgap requirements may be used as well. The doping profile of layers 126 and 127 will be discussed in connection with FIG. 20.

Figure 5:
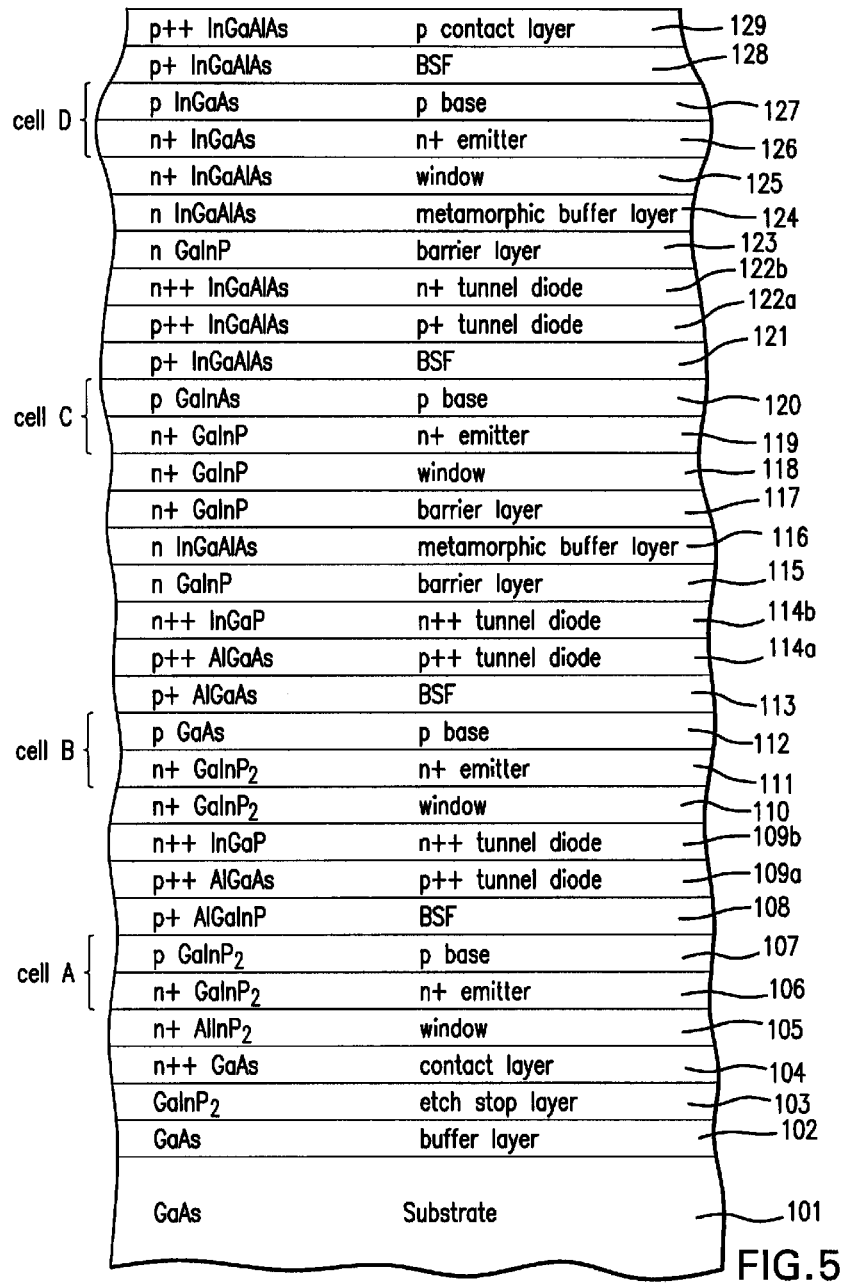
FIG. 5 is a cross-sectional view of the solar cell of FIG. 4 after the next sequence of process steps.

Turning next to FIG. 5, A BSF layer 128, preferably composed of p+ type InGaAlAs, is then deposited on top of the cell D, the BSF layer performing the same function as the BSF layers 108, 113 and 121.

Finally a high band gap contact layer 129, preferably composed of p++ type InGaAlAs, is deposited on the BSF layer 128.

The composition of this contact layer 129 located at the bottom (non-illuminated) side of the lowest band gap photovoltaic cell (i.e., subcell "D" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

Figure 6:
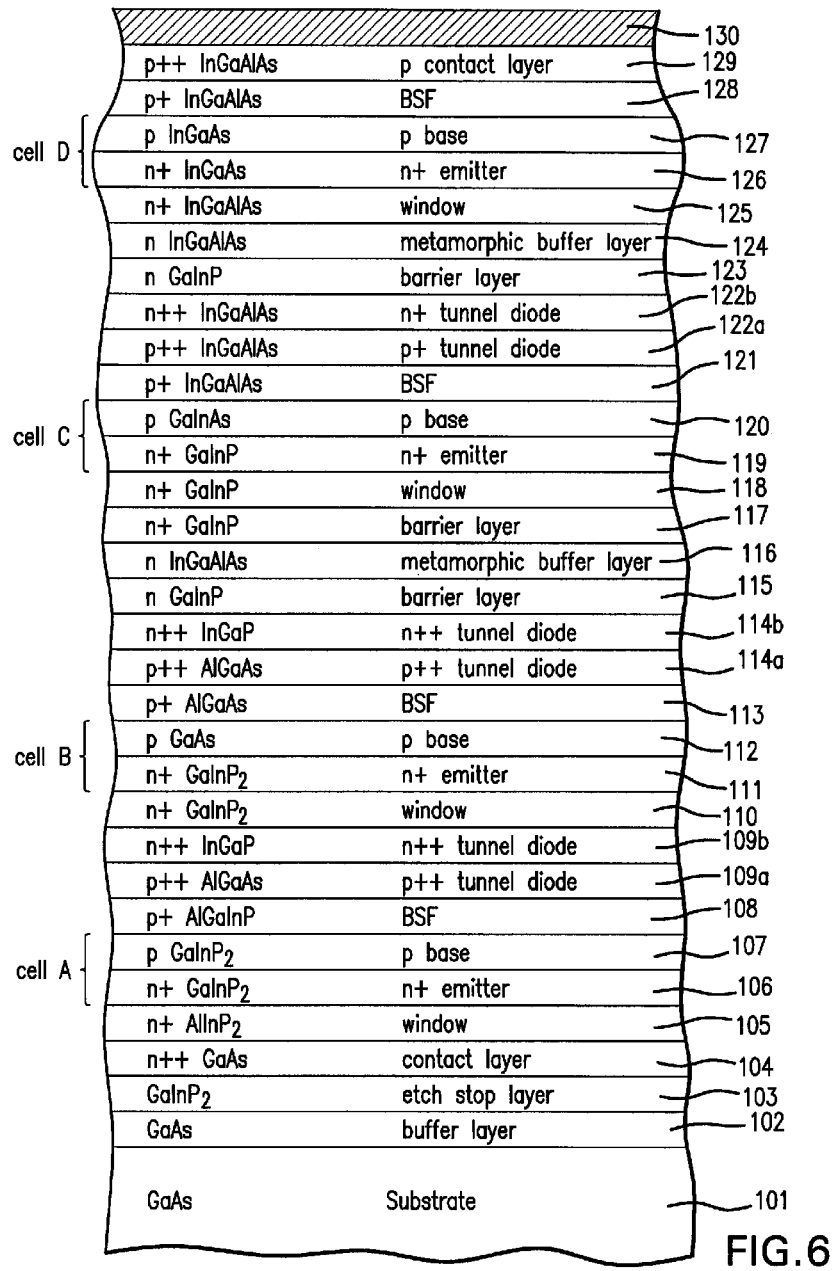
FIG. 6 is a cross-sectional view of the solar cell of FIG. 5 after the next process step.

FIG. 6 is a cross-sectional view of the solar cell of FIG. 5 after the next process step in which a metal contact layer 123 is deposited over the p+ semiconductor contact layer 122. The metal is preferably the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 7:
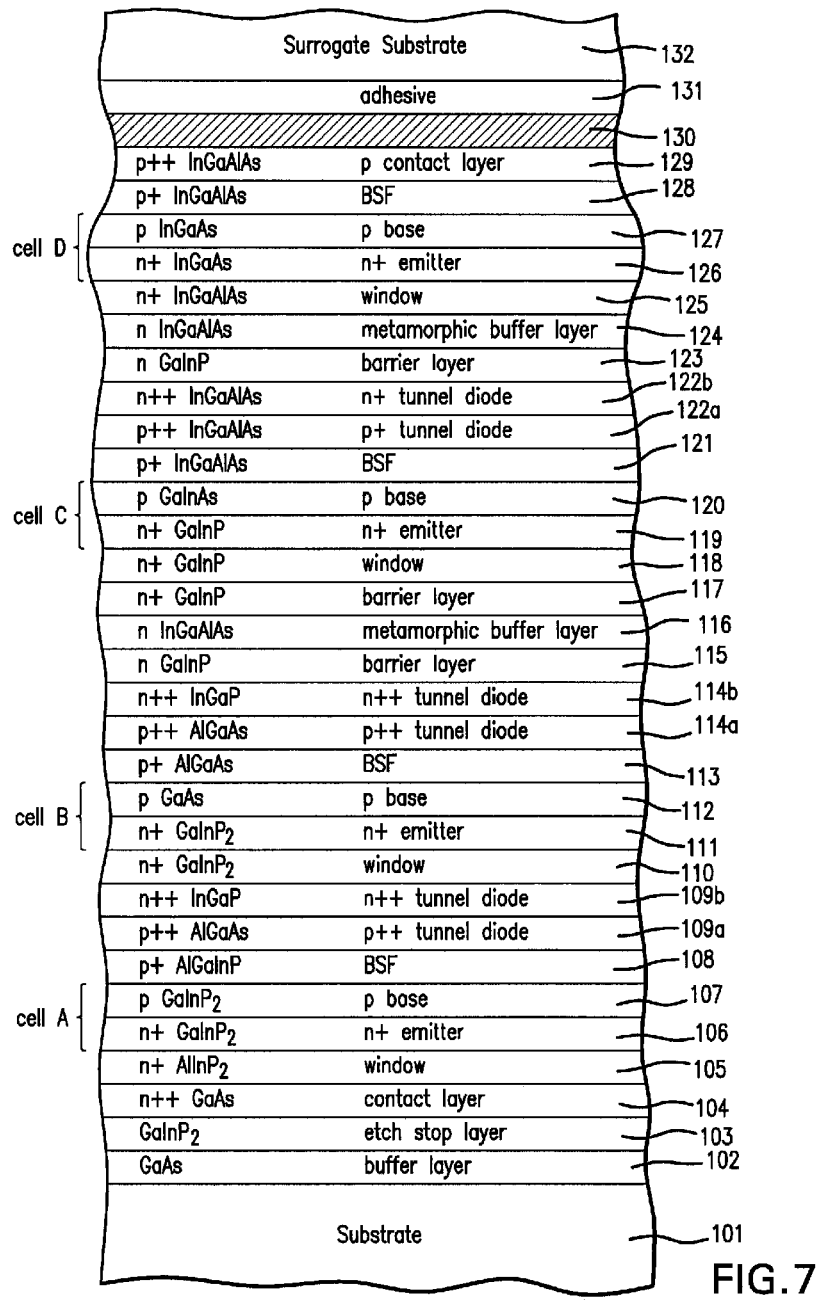
FIG. 7 is a cross-sectional view of the solar cell of FIG. 6 after the next process step in which a surrogate substrate is attached.

FIG. 7 is a cross-sectional view of the solar cell of FIG. 3 after the next process step in which an adhesive layer 131 is deposited over the metal layer 130. The adhesive is preferably Wafer Bond (manufactured by Brewer Science, Inc. of Rolla, Mo.).

In the next process step, a surrogate substrate 132, preferably sapphire, is attached. Alternative, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 131, a suitable substrate (e.g., GaAs) may be eutectically or permanently bonded to the metal layer 130.

Figure 8A:
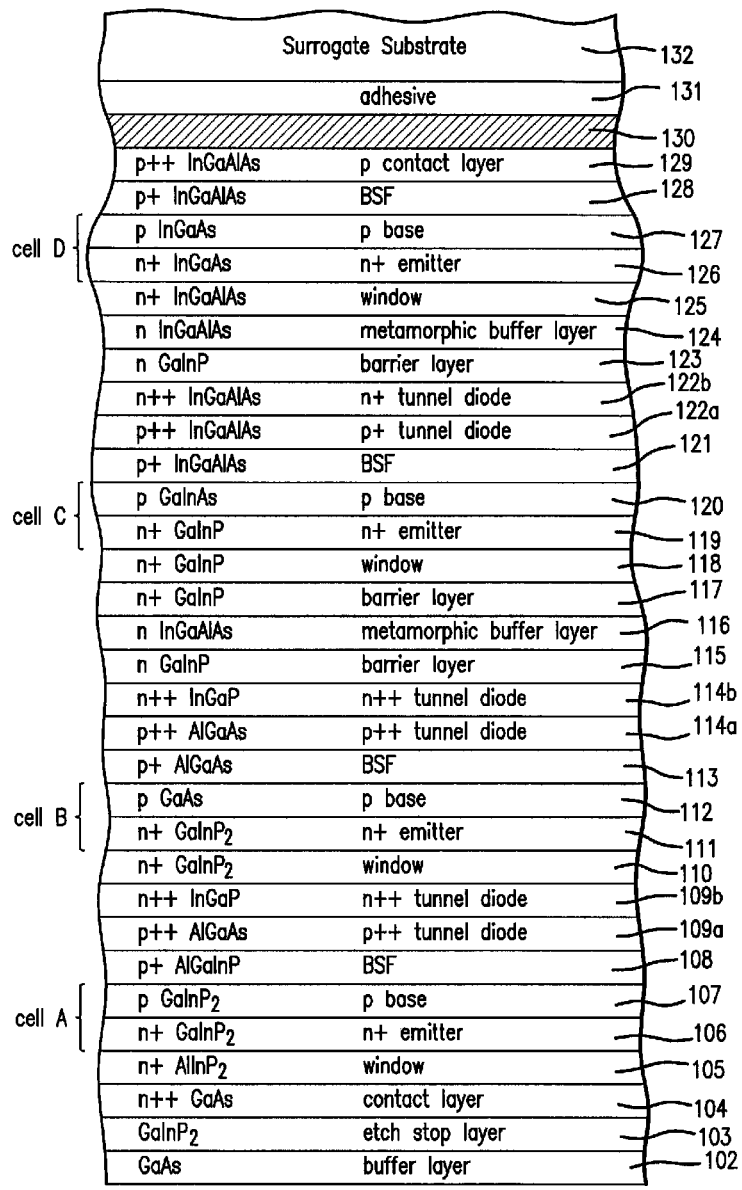
FIG. 8A is a cross-sectional view of the solar cell of FIG. 7 after the next process step in which the original substrate is removed.

FIG. 8A is a cross-sectional view of the solar cell of FIG. 7 after the next process step in which the original substrate is removed by a sequence of lapping and/or etching steps in which the substrate 101, and the buffer layer 103 are removed. The choice of a particular etchant is growth substrate dependent.

Figure 8B:
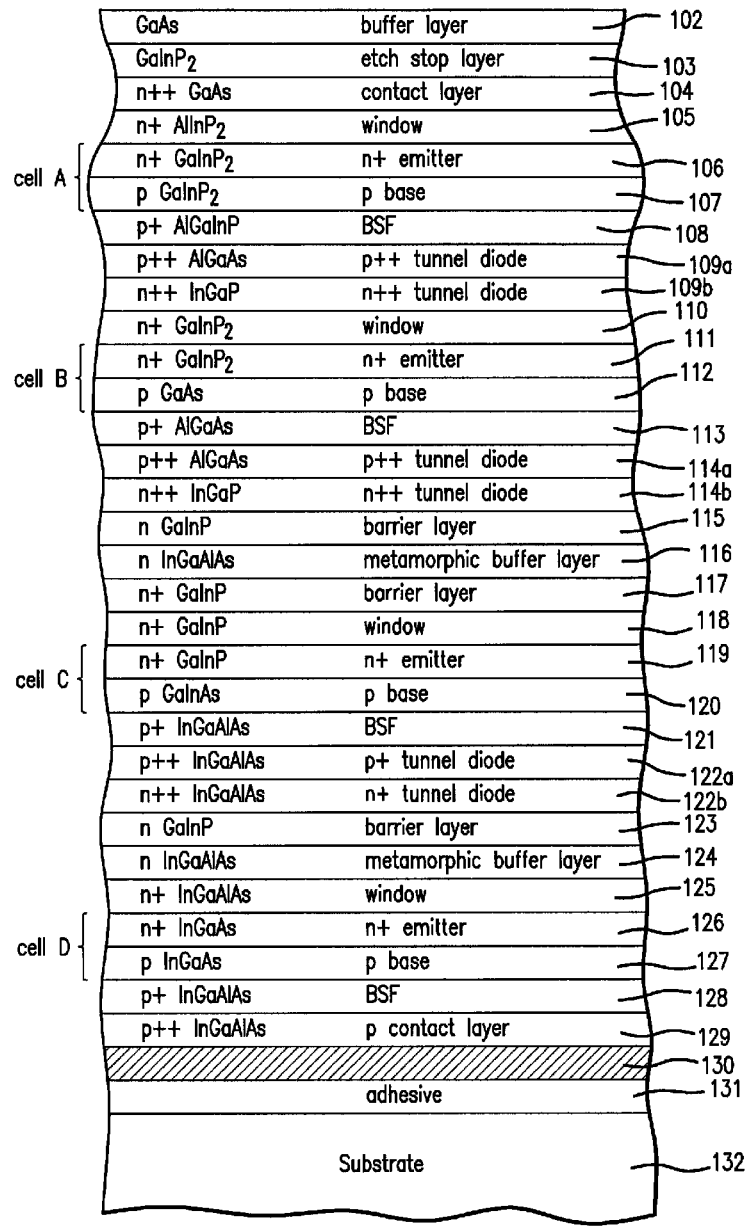
FIG. 8B is another cross-sectional view of the solar cell of FIG. 8A with the surrogate substrate on the bottom of the Figure.

FIG. 8B is a cross-sectional view of the solar cell of FIG. 8A with the orientation with the surrogate substrate 132 being at the bottom of the Figure. Subsequent Figures in this application will assume such orientation.

Figure 9:
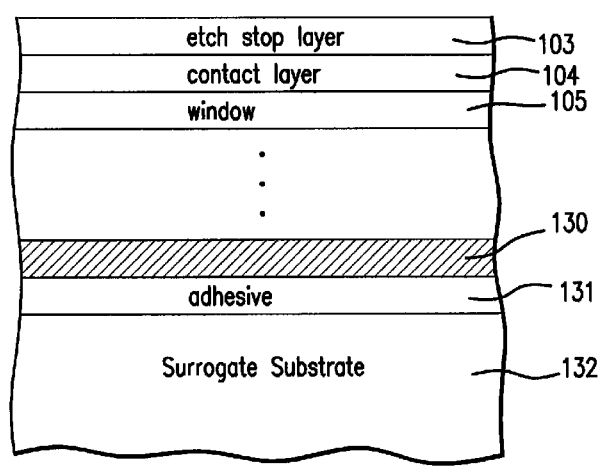
FIG. 9 is a simplified cross-sectional view of the solar cell of FIG. 8B after the next process step.

FIG. 9 is a simplified cross-sectional view of the solar cell of FIG. 8B depicting just a few of the top layers and lower layers over the surrogate substrate 132.

Figure 10:
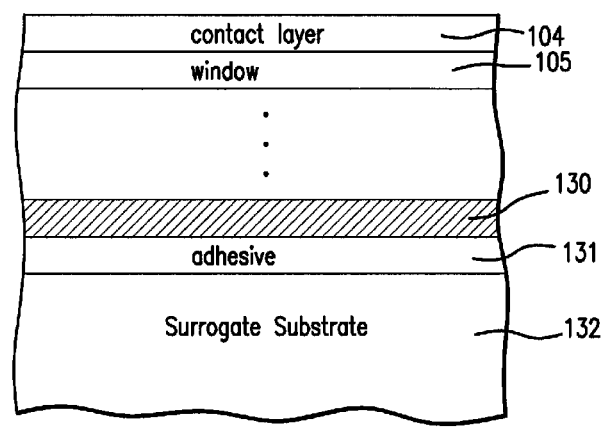
FIG. 10 is a cross-sectional view of the solar cell of FIG. 9 after the next process step.

FIG. 10 is a cross-sectional view of the solar cell of FIG. 9 after the next process step in which the etch stop layer 103 is removed by a HCl/$H_2O$ solution.

Figure 11:
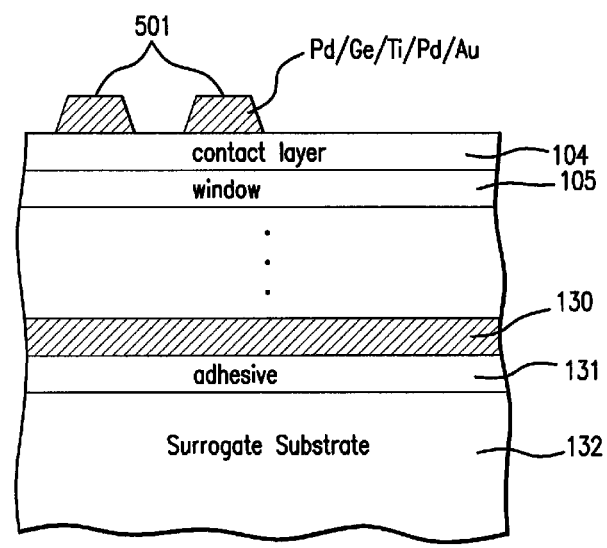
FIG. 11 is a cross-sectional view of the solar cell of FIG. 10 after the next process step.

FIG. 11 is a cross-sectional view of the solar cell of FIG. 10 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. patent application Ser. No. 12/218,582 filed Jul. 18, 2008, hereby incorporated by reference, the grid lines 501 are preferably composed of Pd/Ge/Ti/Pd/Au, although other suitable materials may be used as well.

Figure 12:
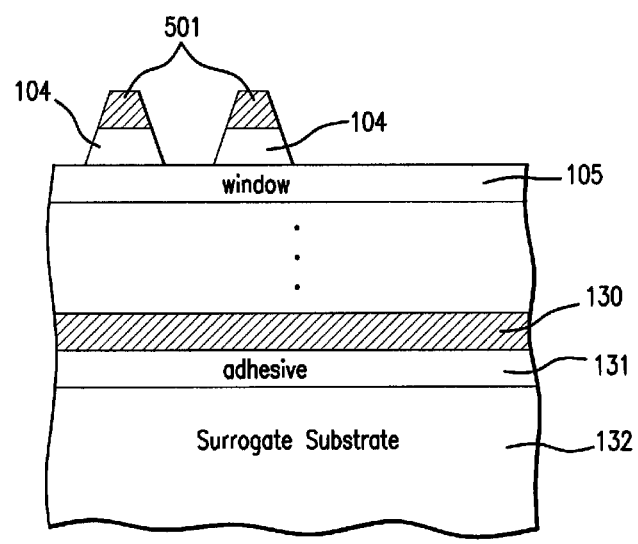
FIG. 12 is a cross-sectional view of the solar cell of FIG. 11 after the next process step.

FIG. 12 is a cross-sectional view of the solar cell of FIG. 11 after the next process step in which the grid lines are used as a mask to etch down the surface to the window layer 105 using a citric acid/peroxide etching mixture.

Figure 13A:
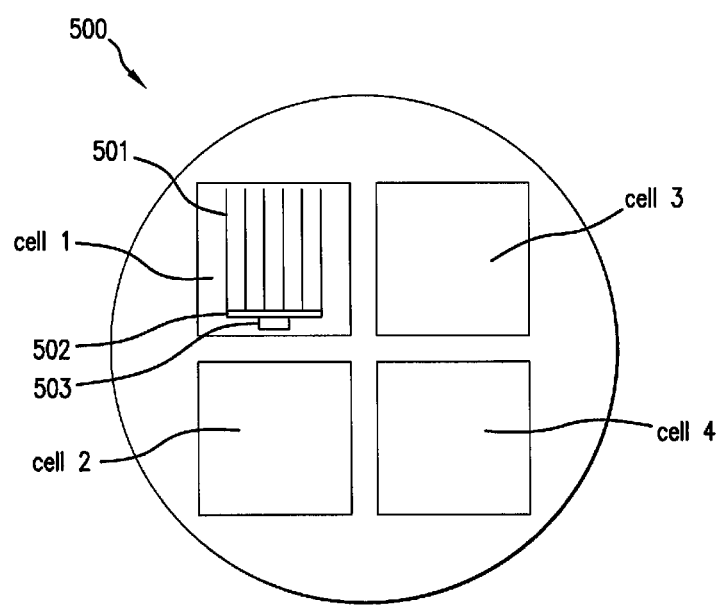
FIG. 13A is a top plan view of a wafer in which the solar cells are fabricated.

FIG. 13A is a top plan view of a wafer in which four solar cells are implemented. The depiction of four cells is for illustration for purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines and the contact pad are illustrative and the present invention is not limited to the illustrated embodiment.

Figure 13B:
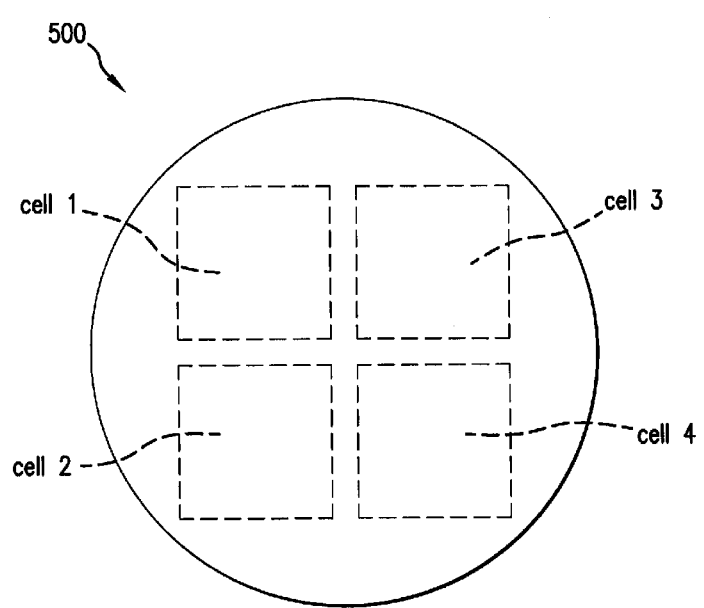
FIG. 13B is a bottom plan view of a wafer in which the solar cells are fabricated.

FIG. 13B is a bottom plan view of the wafer with four solar cells shown in FIG. 13A.

Figure 14:
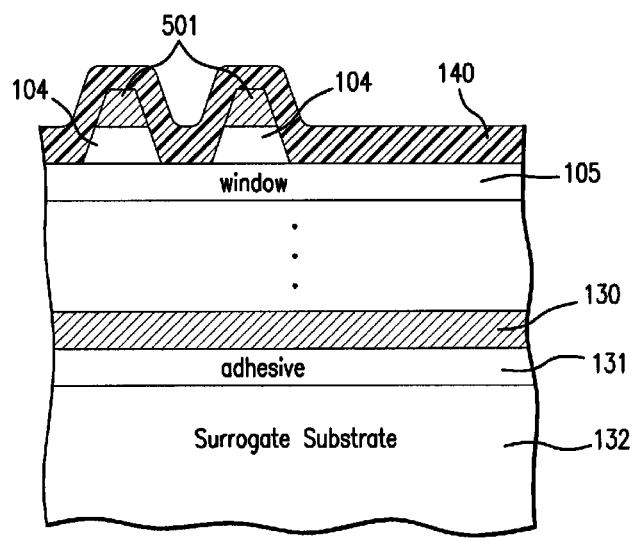
FIG. 14 is a cross-sectional view of the solar cell of FIG. 12 after the next process step.

FIG. 14 is a cross-sectional view of the solar cell of FIG. 12 after the next process step in which an antireflective (ARC) dielectric coating layer 130 is applied over the entire surface of the "bottom" side of the wafer with the grid lines 501.

Figure 15:
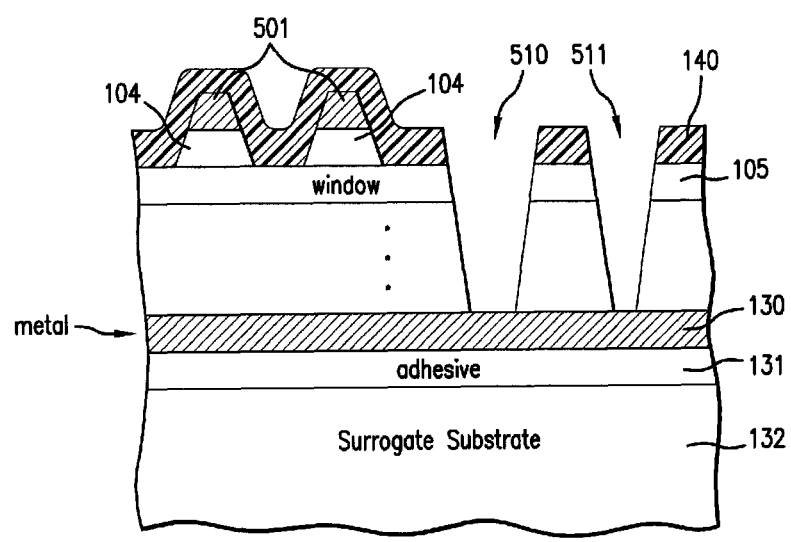
FIG. 15 is a cross-sectional view of the solar cell of FIG. 14 after the next process step.

FIG. 15 is a cross-sectional view of the solar cell of FIG. 14 after the next process step according to the present invention in which first and second annular channels 510 and 511, or portion of the semiconductor structure are etched down to the metal layer 130 using phosphide and arsenide etchants. These channels define a peripheral boundary between the cell and the rest of the wafer, and leaves a mesa structure which constitutes the solar cell. The cross-section depicted in FIG. 15 is that as seen from the A-A plane shown in FIG. 17. In a preferred embodiment, channel 510 is substantially wider than that of channel 511.

Figure 16:
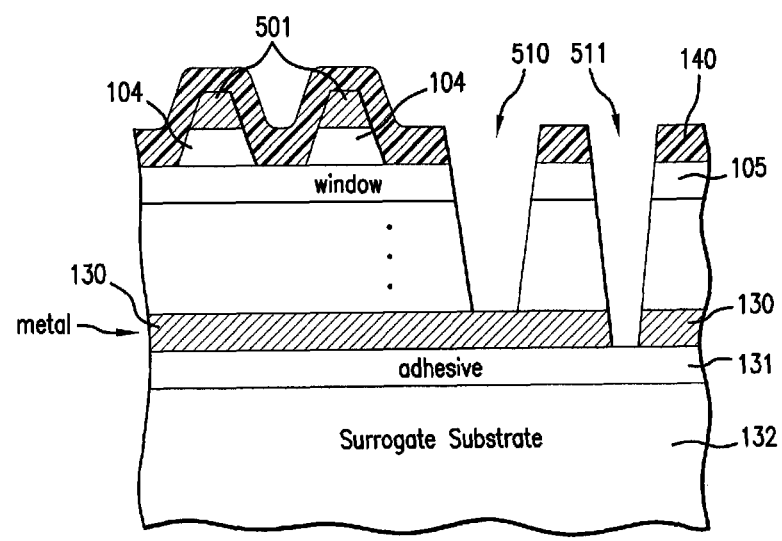
FIG. 16 is a cross-sectional view of the solar cell of FIG. 15 after the next process step

FIG. 16 is a cross-sectional view of the solar cell of FIG. 15 after the next process step in which channel 511 is exposed to a metal etchant, and that portion of the metal layer 130 located at the bottom of the channel 511 is removed. The depth of the channel 511 is thereby extended to approximately to the top surface of the adhesive layer 131.

Figure 17:
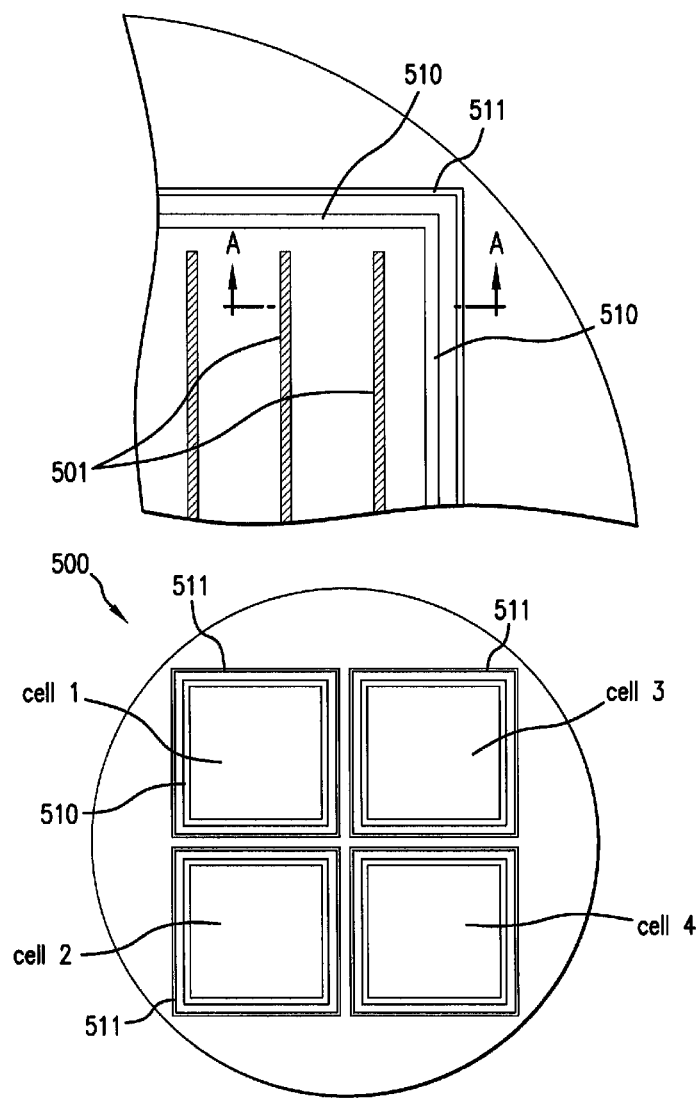
FIG. 17 is a top plan view of the wafer of FIG. 16 depicting the surface view of the trench etched around the cell.

FIG. 17 is a top plan view of the wafer of FIG. 16 depicting the channels 510 and 511 etched around the periphery of each cell.

Figure 18A:
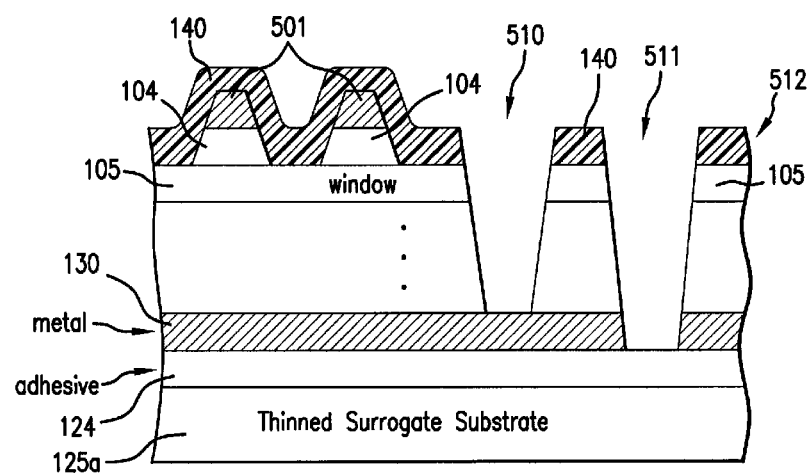
FIG. 18A is a cross-sectional view of the solar cell of FIG. 16 after the next process step in a first embodiment of the present invention.
Figure 18B:
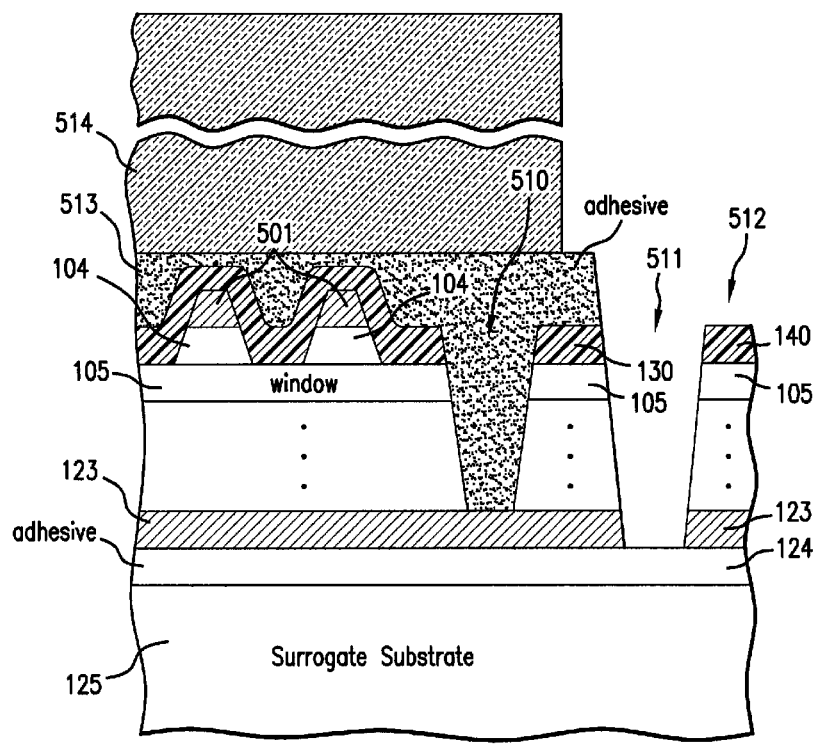
FIG. 18B is a cross-sectional view of the solar cell of FIG. 16 after the next process step in a second embodiment of the present invention.

FIG. 18A is a cross-sectional view of the solar cell of FIG. 16 after the next process step in a first embodiment of the present invention in which the surrogate substrate 132 is appropriately thinned to a relatively thin layer 132a, by grinding, lapping, or etching. In this embodiment, the thin layer 132a forms the support for the solar cell in applications where a cover glass, such as provided in the second embodiment to be described below, is not required. In such an embodiment, electrical contact to the metal contact layer 130 may be made through the channel 510 or by other via structures FIG. 18B is a cross-sectional view of the solar cell of FIG. 16 after the next process step in a second embodiment of the present invention in which a cover glass 514 is secured to the top of the cell by an adhesive 513. The cover glass 514 preferably covers the entire channel 510, but does not extend to the periphery of the cell near the channel 511. Although the use of a cover glass is the preferred embodiment, it is not necessary for all implementations, and additional layers or structures may also be utilized for providing additional support or environmental protection to the solar cell.

Figure 19:
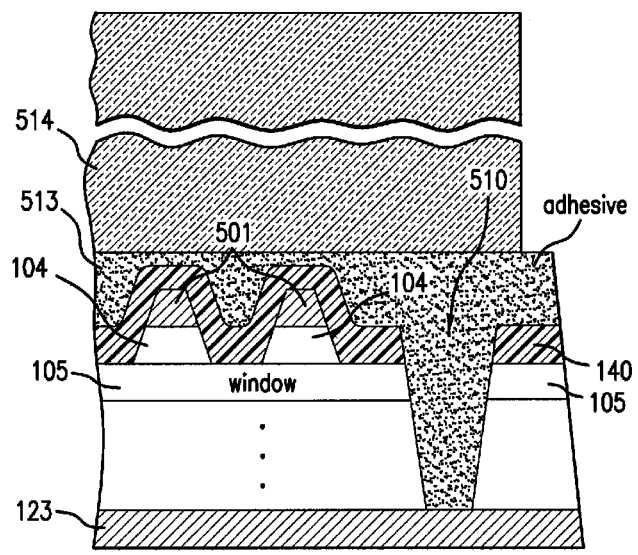
FIG. 19 is a cross-sectional view of the solar cell of FIG. 18 after the next process step.

FIG. 19 is a cross-sectional view of the solar cell of FIG. 18B after the next process step of the present invention in which the adhesive layer 131, the surrogate substrate 132 and the peripheral portion 512 of the wafer is entirely removed, breaking off in the region of the channel 510, leaving only the solar cell with the cover glass 514 (or other layers or structures) on the top, and the metal contact layer 130 on the bottom, which forms the backside contact of the solar cell. The surrogate substrate is preferably removed by the use of the etchant EKC 922. As noted above, the surrogate substrate includes perforations over its surface that allow the flow of etchant through the surrogate substrate 132 to permit its lift off. The surrogate substrate may be reused in subsequent wafer processing operations.

Figure 20:
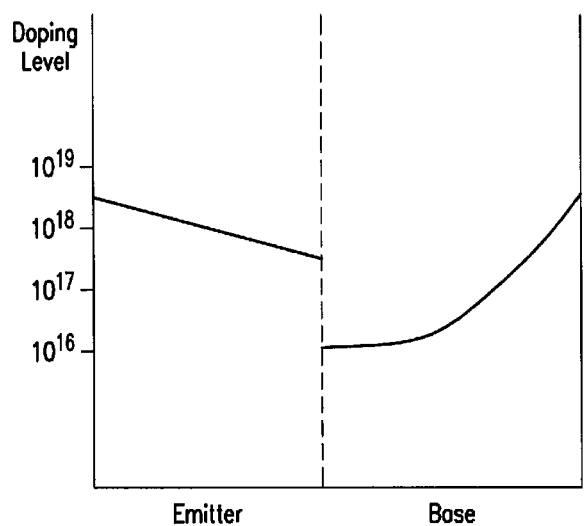
FIG. 20 is a graph of the doping profile in a base and emitter layers of a subcell in the metamorphic solar cell according to the present invention.

FIG. 20 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 21:
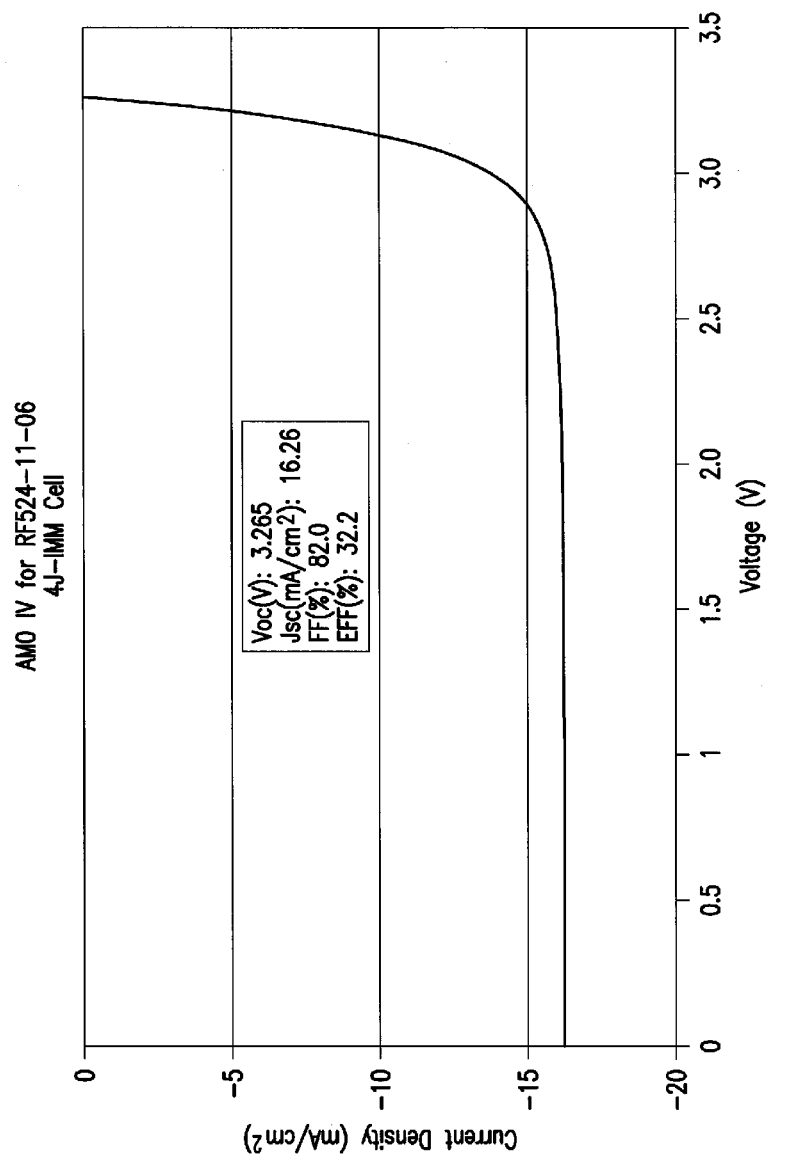
FIG. 21 is a graph that depicts the current and voltage characteristics of an inverted metamorphic multijunction solar cell according to the present invention.

FIG. 21 is a graph that depicts the current and voltage characteristics of one of the test solar cells fabricated according to the present invention. In this test cell, the lower fourth subcell had a band gap in the range of approximately 0.6 to 0.8 eV, the third subcell had a band gap in the range of approximately 0.9 to 1.1 eV, the second subcell had a band gap in the range of approximately 1.35 to 1.45 eV and the upper subcell had a band gap in the range of 1.8 to 2.1 eV. The solar cell was measured to have an open circuit voltage ($V_{oc}$) of approximately 3.265 volts, a short circuit current of approximately 16.26 mA/cm$^2$, a fill factor of approximately 82%, and an efficiency of 32.2%.

Figure 22:
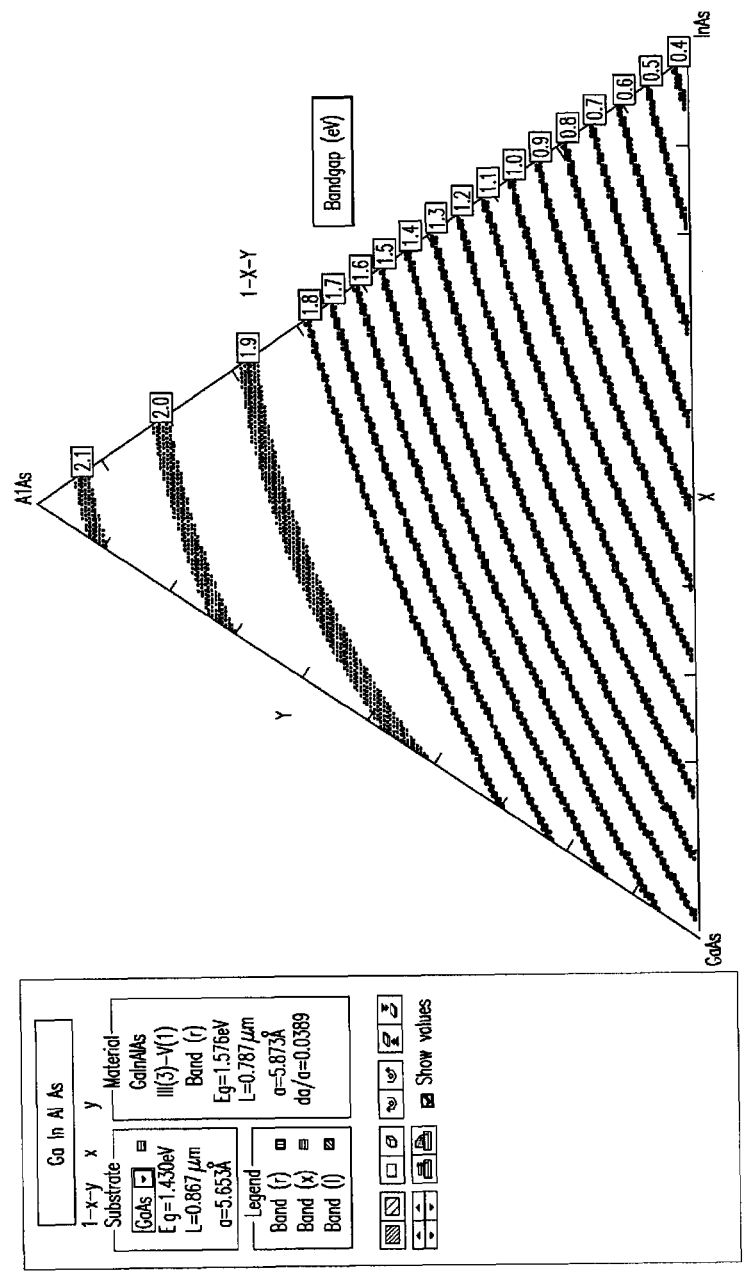
FIG. 22 is a diagram representing the range of band gaps of various GaInAlAs materials as a function of the relative concentration of Al, In, and Ga.

FIG. 22 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 23:
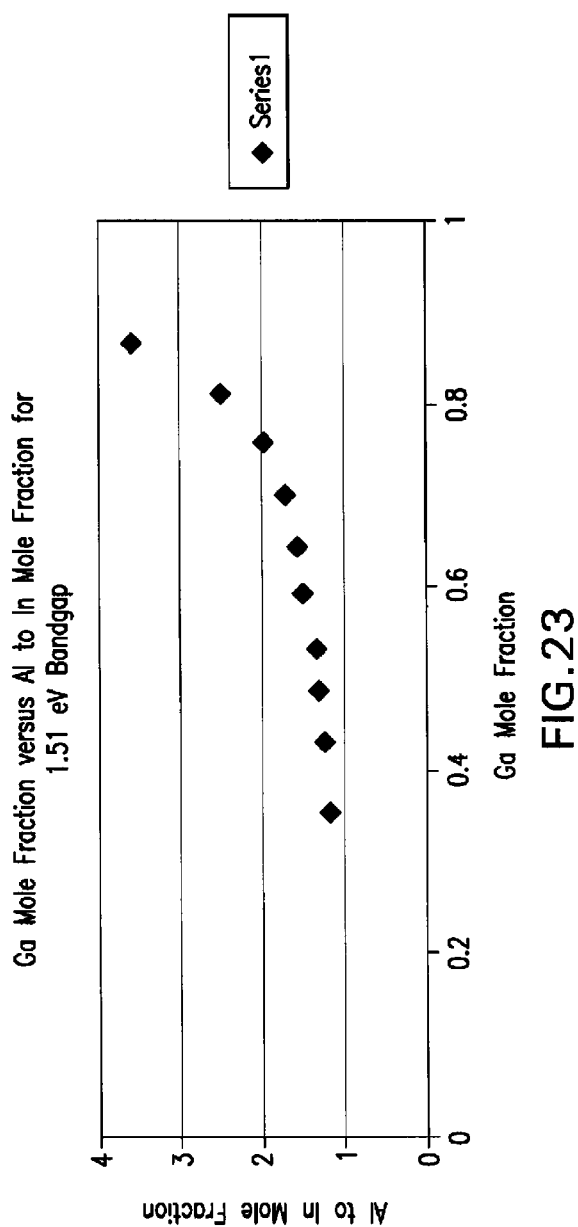
FIG. 23 is a graph representing the Ga mole fraction versus the Al to In mole fraction in GaInAlAs materials that is necessary to achieve a constant 1.5 eV band gap.

FIG. 23 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.5 eV band gap.

Figure 24:
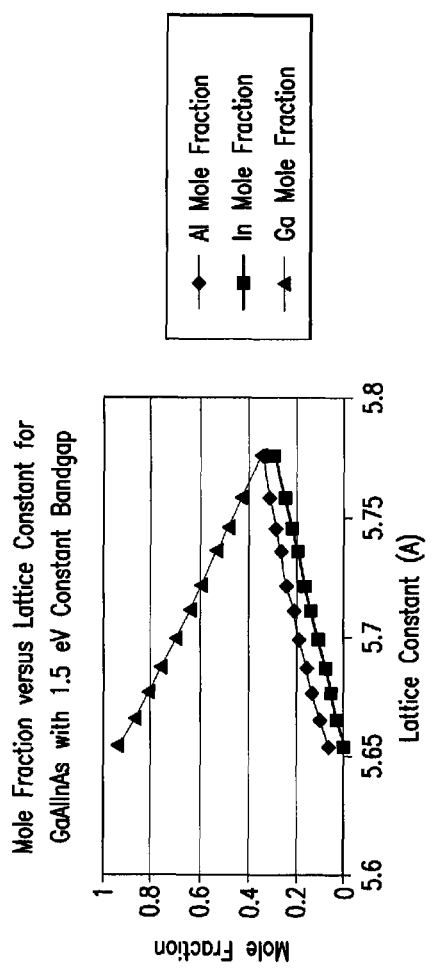
FIG. 24 is a graph representing the mole fraction versus lattice constant in GaInAlAs materials that is necessary to achieve a constant 1.5 eV band gap band gap.

FIG. 24 is a graph that further illustrates the selection of a constant band gap sequence of layers of GaInAlAs used in the metamorphic layer by representing the mole fraction versus lattice constant in GaInAlAs materials that is necessary to achieve a constant 1.5 eV band gap band gap.

It will be understood that each of the elements described above, or two or more together, also may find a useful application in other types of constructions differing from the types of constructions described above.

Although the preferred embodiment of the present invention utilizes a vertical stack of four subcells, the present invention can apply to stacks with fewer or greater number of subcells, i.e. two junction cells, three junction cells, five junction cells, etc. In the case of four or more junction cells, the use of more than one metamorphic grading interlayer may also be utilized.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. patent application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in a inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

The invention claimed is:

1. A multijunction solar cell comprising:
an upper first solar subcell having a first band gap, the upper first solar subcell including an InGaP emitter layer and an InGaP base layer;
a second solar subcell below the first solar subcell and having a second band gap smaller than the first band gap, a base and emitter of the second solar subcell forming a radiation hard heterojunction, wherein the emitter layer of the second solar subcell is composed of InGaP and the base layer of the second solar subcell is composed of GaAs;
a first upper barrier layer below the second solar subcell, the first upper barrier layer being composed of InGaP;
a first graded interlayer, composed of InGaAlAs, disposed below and adjacent to the first upper barrier layer, wherein the first graded interlayer has a third band gap greater than the second band gap, and wherein the band gap of the first graded interlayer remains constant at 1.5 eV throughout its thickness;
a first lower barrier layer disposed below and adjacent to the first graded interlayer, the first lower barrier layer being composed of InGaP and having a composition different from that of the first upper barrier layer;
a third solar subcell below the first lower barrier layer, the third subcell having a fourth band gap smaller than the second band gap such that the third subcell is lattice mismatched with respect to the second subcell, a base and emitter of the third solar subcell forming a radiation hard heterojunction, wherein the emitter layer of the third solar subcell is composed of InGaP and the base layer of the third solar subcell is composed of InGaAs, and wherein the first graded interlayer provides a gradual transition in lattice constant from the second solar subcell to the third solar subcell;
a second upper barrier layer below the third solar subcell;
a second graded interlayer, composed of InGaAlAs, disposed below and adjacent to the second upper barrier layer, wherein the second graded interlayer has a fifth band gap greater than the fourth band gap, and wherein the band gap of the second graded interlayer remains constant at 1.1 eV throughout its thickness;
a second lower barrier layer disposed below and adjacent to the second graded interlayer; and
a lower fourth solar subcell below the second lower barrier layer, wherein the fourth subcell has a sixth band gap smaller than the fourth band gap such that the fourth solar subcell is lattice mismatched with respect to the third solar subcell, wherein an emitter layer and base layer of the fourth solar subcell are composed of InGaAs, and wherein the second graded interlayer provides a gradual transition in lattice constant from the third solar subcell to the lower fourth solar subcell, wherein each of the first upper barrier layer and the first lower barrier layer has a respective-composition different from the first graded interlayer, wherein each of the second upper barrier layer and the second lower barrier layer has a composition different from the second graded interlayer, and wherein the first upper barrier layer, the first lower barrier layer, the second upper barrier layer and the second lower barrier layer collectively help prevent threading dislocations from propagating into adjacent solar subcells in a direction of growth of the solar cell and in a direction opposite the direction of growth.

2. The multijunction solar cell of claim 1, wherein the second upper barrier layer is composed of GaInP.

3. The multijunction solar cell of claim 1, wherein the first graded interlayer is compositionally graded to lattice match the second solar subcell on one side and the third solar subcell on the other side.

4. The multijunction solar cell of claim 1, wherein the second graded interlayer is compositionally graded to lattice match the third solar subcell on one side and the fourth solar subcell on the other side.

5. The multijunction solar cell of claim 1, wherein said first graded interlayer is composed of III-V compound semiconductors subject to the constraints of having the in-plane lattice parameter greater or equal to that of the second solar subcell and less than or equal to that of the third solar subcell, and having a band gap energy greater than that of the second solar subcell and of the third solar subcell.

6. The multijunction solar cell of claim 1, wherein the fourth solar subcell has a band gap in the range of 0.6 to 0.8 eV, the third solar subcell has a band gap in the range of 0.9 to 1.1 eV, the second solar subcell has a band gap in the range of 1.35 to 1.45 eV and the first solar subcell has a band gap in the range of 1.8 to 2.1 eV.

7. A method of manufacturing a solar cell comprising:
providing a first substrate;
depositing over the first substrate a first sequence of layers of semiconductor material forming a first solar subcell and a second solar subcell;
depositing over the first sequence of layers a first barrier layer, the first barrier layer being composed of InGaP;
depositing over the first barrier layer a first graded interlayer composed of InGaAlAs and having a band gap that remains constant throughout its thickness at 1.5 eV, wherein the first graded interlayer has a composition different from the first barrier layer;
depositing over the first graded interlayer a second barrier layer having a composition different from the first graded interlayer, the second barrier layer being composed of InGaP and having a composition different from that of the first barrier layer;
depositing over the second barrier layer a second sequence of layers of semiconductor material forming a third solar subcell;
depositing over the second sequence of layers a third barrier layer;
depositing over the third barrier layer a second graded interlayer composed of InGaAlAs and having a band gap that remains constant throughout its thickness at 1.1 eV, wherein the second graded interlayer has a composition different from the third barrier layer;

depositing over the second graded interlayer a fourth barrier layer;
depositing over the fourth barrier layer a third sequence of layers of semiconductor material forming a fourth solar subcell;
mounting a surrogate substrate over the third sequence of layers; and
removing the first substrate;
wherein the first, second, third and fourth barrier layers help prevent threading dislocations from propagating into adjacent solar subcells.

8. The method of claim 7, wherein the first graded interlayer is compositionally graded to lattice match the second solar subcell on one side and the third solar subcell on the other side.

9. The method of claim 7, wherein the second graded interlayer is compositionally graded to lattice match the third solar subcell on one side and the fourth solar subcell on the other side.

10. A multijunction solar cell comprising:
an upper first solar subcell having a first band gap in the range of 1.8 to 2.1 eV;
a second solar subcell below the first solar subcell and having a second band gap in the range of 1.35 to 1.45 eV;
a first barrier layer below the second solar subcell, the first barrier layer being composed of InGaP;
a first graded interlayer, composed of InGaAlAs, disposed below and adjacent the first barrier layer, wherein the first graded interlayer has a third band gap greater than the second band gap, and wherein the band gap of the first graded interlayer remains constant at 1.5 eV throughout its thickness;
a third solar subcell below the first graded interlayer, the third subcell having a fourth band gap in the range of 0.9 to 1.1 eV such that the third subcell is lattice mismatched with respect to the second solar subcell;
a second barrier layer below the third solar subcell, the second barrier layer being composed of InGaP and having a composition different from that of the first barrier layer;
a second graded interlayer, composed of InGaAlAs, disposed below and adjacent the second barrier layer, wherein the second graded interlayer has a fifth band gap greater than the fourth band gap, and wherein the band gap of the second graded interlayer remains constant at 1.1 eV throughout its thickness; and
a lower fourth solar subcell below the second graded interlayer, wherein the fourth solar subcell has a sixth band gap in the range of 0.6 to 0.8 eV such that the fourth solar subcell is lattice mismatched with respect to the third solar subcell,
wherein the first barrier layer has a composition different from the first graded interlayer and is in direct contact with the first graded interlayer, and wherein the second barrier layer has a composition different from the second graded interlayer and is in direct contact with the second graded interlayer, and
wherein the first and second barrier layers help prevent threading dislocations from propagating into adjacent solar subcells.

11. The multijunction solar cell of claim 10, wherein the multijunction solar cell has an efficiency of at least 32%.

12. The multijunction solar cell of claim 10, wherein:
the second solar subcell has a base and emitter that form a heterojunction, and the third solar subcell has a base and emitter that form a heterojunction, wherein the first graded interlayer is compositionally graded to lattice match the second solar subcell on one side and the third solar subcell on its other side, the second graded interlayer is compositionally graded to lattice match the third solar subcell on one side and the fourth solar subcell on its other side.

13. The method of claim 7 wherein the third barrier layer is composed of GaInP.

\* \* \* \* \*